(12) United States Patent
Lee et al.

(10) Patent No.: US 9,166,094 B2
(45) Date of Patent: Oct. 20, 2015

(54) METHOD FOR FORMING SOLAR CELLS

(71) Applicant: Taiwan Semiconductor Manufacturing Co., Ltd., Hsin-Chu (TW)

(72) Inventors: Wen-Chin Lee, Baoshan Township (TW); Yung-Sheng Chiu, Fusing Township (TW); Wen-Tsai Yen, Caotun Township (TW); Liang-Sheng Yu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/258,146

(22) Filed: Apr. 22, 2014

(65) Prior Publication Data

US 2014/0227822 A1    Aug. 14, 2014

Related U.S. Application Data

(62) Division of application No. 13/326,458, filed on Dec. 15, 2011, now abandoned.

(51) Int. Cl.
*H01L 31/18* (2006.01)
*H01L 31/0392* (2006.01)
*H01L 31/0749* (2012.01)
*H01L 31/0216* (2014.01)
*H01L 31/0224* (2006.01)

(52) U.S. Cl.
CPC .......... *H01L 31/18* (2013.01); *H01L 31/02167* (2013.01); *H01L 31/022466* (2013.01); *H01L 31/0392* (2013.01); *H01L 31/0749* (2013.01); *Y02E 10/541* (2013.01)

(58) Field of Classification Search
CPC .. H01L 31/18; H01L 31/1876; H01L 31/1884
USPC .......................................... 438/72
See application file for complete search history.

(56) References Cited

U.S. PATENT DOCUMENTS

| | | | | |
|---|---|---|---|---|
| 4,262,161 A * | 4/1981 | Carey | ............. | 136/256 |
| 5,821,597 A | 10/1998 | Nakajima et al. | | |
| 2005/0076945 A1* | 4/2005 | Tachibana et al. | ........... | 136/244 |
| 2006/0213548 A1* | 9/2006 | Bachrach et al. | ............ | 136/251 |
| 2007/0068571 A1* | 3/2007 | Li et al. | ......... | 136/258 |
| 2009/0194161 A1* | 8/2009 | Ji et al. | ......... | 136/256 |
| 2010/0193022 A1* | 8/2010 | Hong et al. | ......... | 136/256 |

(Continued)

FOREIGN PATENT DOCUMENTS

| | | |
|---|---|---|
| DE | 10136743 A1 | 2/2003 |
| DE | 102004055333 | 5/2006 |
| DE | 102004055333 A1 | 5/2006 |

OTHER PUBLICATIONS

Johnson, P.K. et al., "A Comparative Study of Defect States in Evaporated and Selenized CIGS(S) Solar Cells", Prog. Photovolt: Res. Appl. 2005, 13:1-8.

(Continued)

*Primary Examiner* — Earl Taylor
(74) *Attorney, Agent, or Firm* — Duane Morris LLP

(57) ABSTRACT

A method for forming a thin film solar cell that includes one or more moisture barrier layer made of a water-insoluble material for protection against water and oxygen damage to the top electrode layer material is disclosed.

15 Claims, 5 Drawing Sheets

(56) References Cited

U.S. PATENT DOCUMENTS

| | | | |
|---|---|---|---|
| 2010/0243029 A1* | 9/2010 | Higashi et al. | 136/244 |
| 2011/0100460 A1* | 5/2011 | Bryden et al. | 136/260 |
| 2011/0120553 A1* | 5/2011 | Watai et al. | 136/256 |
| 2011/0197967 A1* | 8/2011 | Kaijo et al. | 136/256 |
| 2012/0037225 A1* | 2/2012 | Jee et al. | 136/256 |
| 2013/0118569 A1* | 5/2013 | Lee et al. | 136/256 |
| 2013/0153015 A1* | 6/2013 | Lee et al. | 136/256 |
| 2014/0076392 A1* | 3/2014 | Lin et al. | 136/256 |
| 2014/0227822 A1* | 8/2014 | Lee et al. | 438/64 |

OTHER PUBLICATIONS

Official Action issued Nov. 26, 2012, in counterpart DE Patent Application No. 10 2012 107 588.3.

Physical Constants of Inorganic Compounds; CRC Handbook of Chemistry and Physics: 2012-2013; 93rd edition; pp. 1-59.

Standard Thermodynamic Properties of Chemical Substances; CRC Handbook of Chemistry and Physics; 2012-2013; 93rd edition; pp. 1-39.

Weisstein, Eric; Solubility Rules; 2007; Scienceworld Wolfram.

* cited by examiner

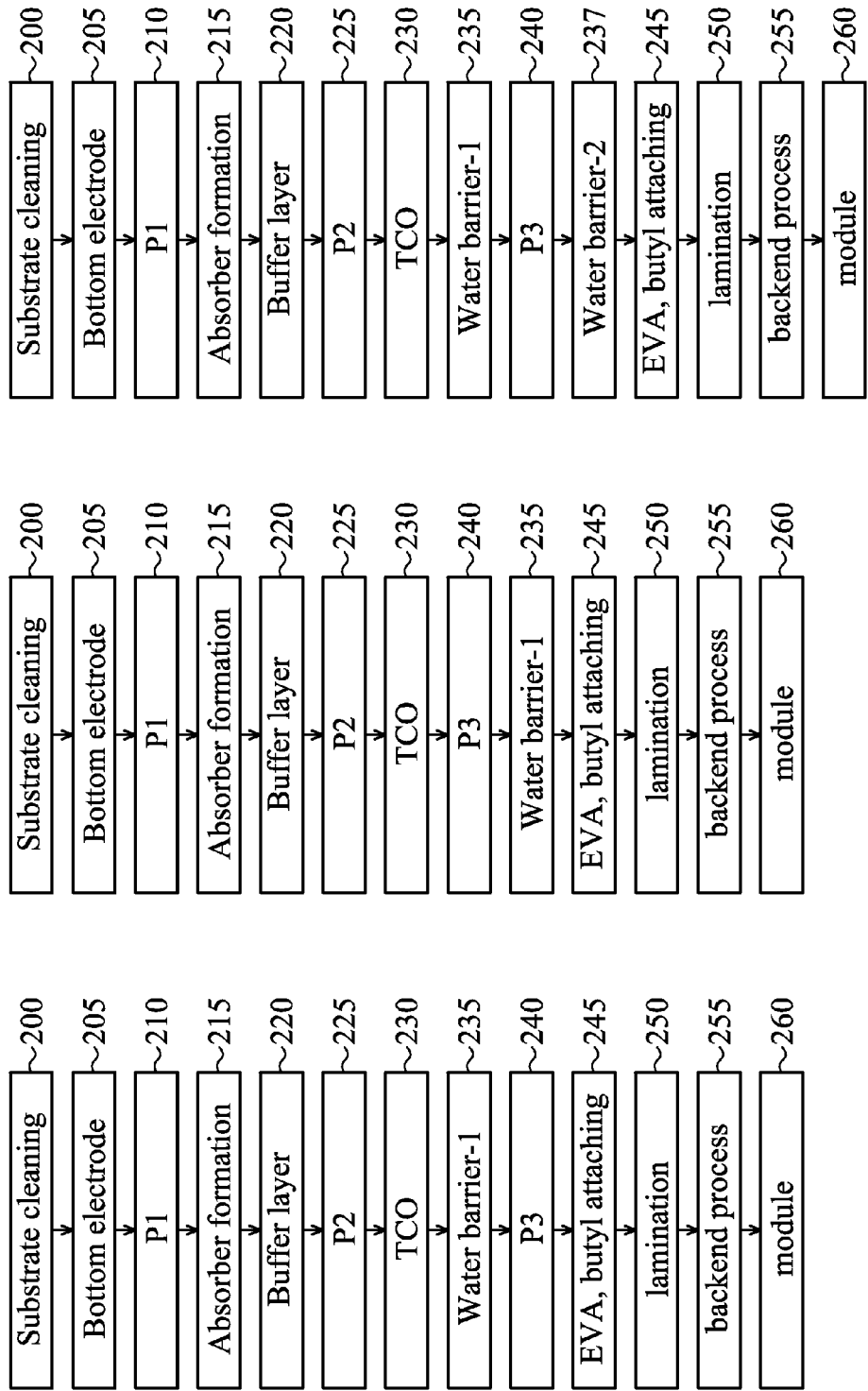

| Element | Oxide | Melting Point (C) | Solubility in H2O | Oxide formation ethalpy at 298.15K (KJ/mol) with 1 mole oxygen |
|---|---|---|---|---|
| Lu | Lu2O3 | 2487 | Insoluble | -1252.1 |
| La | La2O3 | 2307-2315 | Insoluble | -1195.8 |
| Hf | HfO2 | 2758±25 | Insoluble | -1144.7 |
| Al | Al2O3 | 2050 | Insoluble | -1117.1 |
| Zr | ZrO2 | 2700 | Insoluble | -1100.6 |
| Ti | TiO2 | 1830-1850 | Insoluble | -944.0 |
| Ta | TA2O5 | 1872 | Insoluble | -818.4 |
| Cr | Cr2O3 | 2275-2435 | Insoluble | -759.8 |
| Ga | Ga2O3 | 1900 | Insoluble | -726.1 |
| Ca | CaO | 1500 | Insoluble | -634.9 |
| In | In2O3 | 1900-1920 | Insoluble | -617.2 |
| Mg | MgO | 2852 | Insoluble | -601.6 |
| Sn | SnO2 | 1630 | Insoluble | -577.6 |
| Zn | ZnO | 1975 | Insoluble | -350.5 |
| Ru | RuO2 | Decomposes | Insoluble | -305.0 |
| Co | CoO | 1795 | Solvate | -237.9 |
| Cs | Cs2O | 490 | reacts with water | -172.9 |
| Cu | CuO | 1326 | Insoluble | -157.3 |

← Increasing Stability     Decreasing Stability →

FIG. 3

METHOD FOR FORMING SOLAR CELLS

CROSS-REFERENCE TO RELATED APPLICATIONS

The present application is a divisional application of co-pending U.S. patent application Ser. No. 13/326,458, filed on Dec. 15, 2011, the disclosure of which is incorporated herein by reference in its entirety.

FIELD

The present invention generally relates to photovoltaic solar cells, and more particularly to thin film solar cells and methods for forming same.

BACKGROUND

Thin film photovoltaic (PV) solar cells are one class of energy source devices which harness a renewable source of energy in the form of light that is converted into useful electrical energy which may be used for numerous applications. Thin film solar cells are multi-layered semiconductor structures formed by depositing various thin layers and films of semiconductor and other materials on a substrate. These solar cells may be made into light-weight flexible sheets in some forms comprised of a plurality of individual electrically interconnected cells. The attributes of light weight and flexibility gives thin film solar cells broad potential applicability as an electric power source for use in portable electronics, aerospace, and residential and commercial buildings where they can be incorporated into various architectural features such as roof shingles, facades, and skylights.

Thin film solar cell semiconductor packages generally include a bottom contact or electrode formed on the substrate and a top contact or electrode formed above the bottom electrode. Top electrodes have been made for example of light transmittance conductive oxide ("TCO") materials. TCO materials are susceptible to attack and degradation by environment factors including water, oxygen, and carbon dioxide. Such TCO degradation may induce high series resistance (Rs) and result in lower solar energy conversions efficiencies for the solar cell.

An improved thin film solar cell is therefore desired that addresses the foregoing problems.

BRIEF DESCRIPTION OF THE DRAWINGS

The features of the preferred embodiments will be described with reference to the following drawings where like elements are labeled similarly, and in which:

FIG. 2 is a flow chart showing sequential steps in an exemplary process for the formation thereof;

FIG. 3 shows a table of molal standard oxide formation enthalpy in representing Gibbs Free Energy of various materials;

FIG. 5 is a flow chart showing sequential steps in an exemplary process for the formation thereof;

FIG. 7 is a flow chart showing sequential steps in an exemplary process for the formation thereof.

Figure 1:
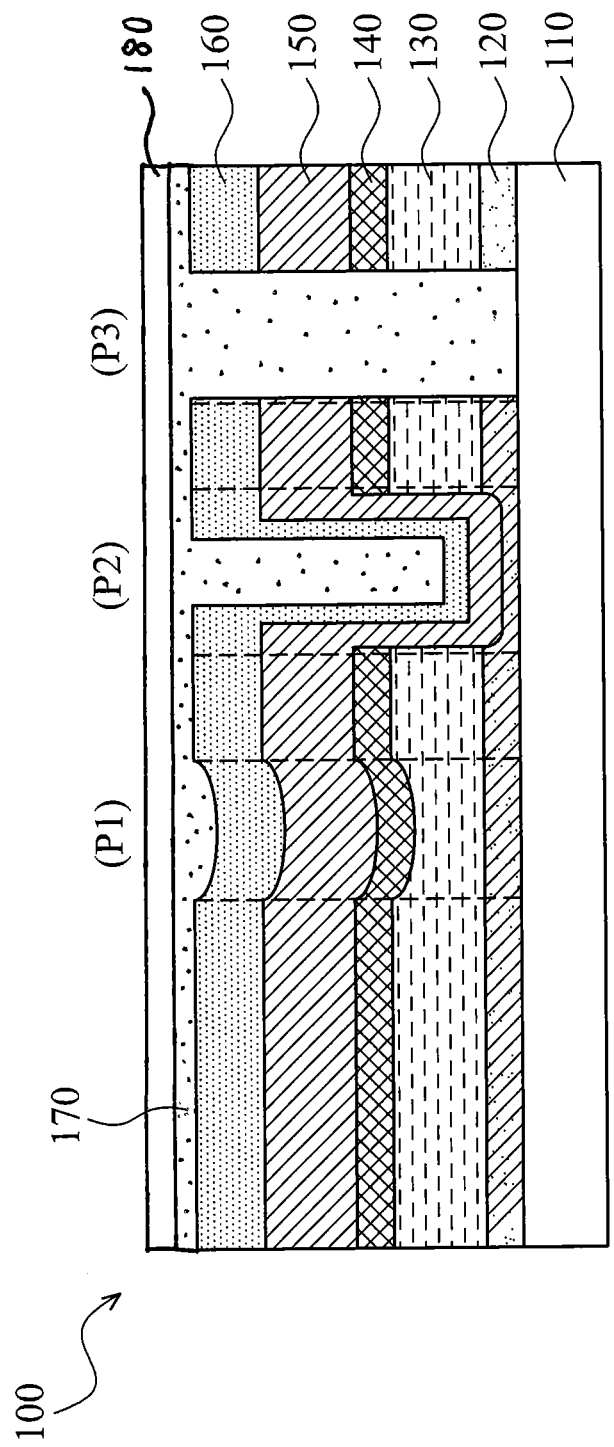
FIG. 1 is a cross-sectional side view of a first embodiment of a thin film solar cell according to the present invention.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

FIG. 1 shows a first embodiment of a thin film solar cell 100 having a moisture barrier formed in-situ during the process of forming the solar cell semiconductor package. Solar cell 100 includes a substrate 110, a bottom electrode layer 120 formed thereon, an absorber layer 130 formed thereon, a buffer layer 140 formed thereon, a TCO top electrode layer 150 formed thereon, and a first protective passivation layer such as moisture barrier layer 160 formed thereon. The passivation or moisture barrier layer 160 helps to protect the TCO material from attack by water and oxygen which adversely affects the performance of the solar cell and reliability.

Solar cell 100 further includes micro-channels which are patterned and scribed into the semiconductor structure to interconnect the various conductive material layers and to separate adjacent solar cells. These micro-channels or "scribe lines" as commonly referred to in the art are given "P" designations related to their function and step during the semi-conductor solar cell fabrication process. The P1 and P3 scribe lines are essentially for cell isolation. P2 scribe line forms a connection. P1 scribe lines interconnect the CIGS absorber layer to the substrate and pattern the TCO panel into individual cells. P2 scribe lines remove absorber material to interconnect the top TCO electrode to the bottom electrode thereby preventing the intermediate buffer layer from acting as a barrier between the top and bottom electrodes. P3 scribe lines extend completely through the TCO, buffer layer, absorber layer, and the bottom electrode to isolate each cell defined by the P1 and P2 scribe lines.

Solar cell 100 and an exemplary embodiment of a method for forming the same as shown in FIG. 2 will now be described in further detail.

Referring now to FIGS. 1 and 2, substrate 110 is first cleaned in step 200 by any suitable conventional means used in the art to prepare the substrate for receiving the bottom electrode layer. In one embodiment, substrate 110 may be cleaned by using detergent or chemical in either brushing tool or ultrasonic cleaning tool.

Suitable conventional materials that may be used for substrate 110 include without limitation glass such as for example without limitation soda lime glass, ceramic, metals such as for example without limitation thin sheets of stainless steel and aluminum, or polymers such as for example without limitation polyamides, polyethylene terephthalates, polyethylene naphthalates, polymeric hydrocarbons, cellulosic polymers, polycarbonates, polyethers, and others. In one preferred embodiment, glass may be used for substrate 110.

Next, bottom electrode layer 120 is then formed on a substrate 110 (step 205) by any conventional method commonly used in the art including without limitation sputtering, atomic layer deposition (ALD), chemical vapor deposition (CVD), or other techniques.

In one embodiment, bottom electrode layer 120 may be made of molybdenum (Mo); however, other suitable electrically conductive metallic and semiconductor materials conventionally used in the art may be used such as Al, Ag, Sn, Ti, Ni, stainless steel, ZnTe, etc.

In some representative embodiments, without limitation, bottom electrode layer 120 may preferably have a thickness ranging from about and including 0.1 to 1.5 microns (μm). In one embodiment, layer 120 has a representative thickness on the order of about 0.5 μm.

With continuing reference to FIGS. 1 and 2, P1 patterned scribe lines are next formed in bottom electrode layer 120 (step 210) to expose the top surface of substrate 110 as shown. Any suitable scribing method commonly used in the art may be used such as without limitation mechanical scribing with a stylus or laser scribing.

A p-type doped semiconductor light absorber layer 130 is next formed on top of bottom electrode layer 120 (step 215). The absorber layer 130 material further fills the P1 scribe line and contacts the exposed top surface of substrate 110 to interconnect layer 130 to the substrate, as shown in FIG. 1.

In one embodiment, absorber layer 130 may be a p-type doped chalcogenide material commonly used in the art, and preferably without limitation CIGS Cu(In,Ga)Se$_2$ in some possible embodiments. Other suitable chalcogenide materials may be used including without limitation Cu(In,Ga)(Se, S)$_2$ or "CIGSS," CuInSe$_2$, CuGaSe$_2$, CuInS$_2$, and Cu(In,Ga)S$_2$.

Suitable p-type semiconductor chalcogenide materials that may commonly be used for forming absorber layer 30 include without limitation Cu(In,Ga)Se$_2$, Ag(In,Ga)Se$_2$, Cu(In,Al)Se$_2$, Cu(In,Ga)(Se, S)$_2$, CuInSe$_2$, CuGaSe$_2$, CuInS$_2$, and Cu(In,Ga)S$_2$ or other elements of group II, III or VI of the periodic table.

Absorber layer 130 formed of CIGS may be formed by any suitable vacuum or non-vacuum process conventionally used in the art. Such processes include, without limitation, selenization, sulfurization after selenization ("SAS"), evaporation, sputtering electrodeposition, chemical vapor deposition, or ink spraying etc.

In some representative embodiments, without limitation, absorber layer 130 may preferably have a thickness ranging from about and including 0.5 to 5.0 microns (μm). In one embodiment, absorber layer 130 has a representative thickness on the order of about 2 μm.

With continuing reference to FIGS. 1 and 2, an n-type buffer layer 140 which may be CdS is then formed on absorber layer 130 to create an electrically active n-p junction (step 220). Buffer layer 140 may be formed any suitable method commonly used in the art. In one embodiment, buffer layer 140 may be formed by a conventional electrolyte chemical bath deposition (CBD) process commonly used in the art for forming such layers using an electrolyte solution that contains sulfur. In some representative embodiments, without limitation, buffer layer 140 may preferably have a thickness ranging from about and including 0.005 to 0.15 microns (μm). In one embodiment, buffer layer 140 has a representative thickness on the order of about 0.015 μm.

After forming CdS buffer layer 140, the P2 scribe lines are next cut through the absorber layer 130 to expose the top surface of the bottom electrode 120 within the open scribe line or channel (step 225). Any suitable method conventionally used in the art may be used to cut the P2 scribe line as previously described, including without limitation mechanical (e.g. cutting stylus) or laser scribing. The P2 scribe line will later be filled with a conductive material from top electrode layer 150 to interconnect the top electrode to the bottom electrode layer 120.

With continuing reference to FIGS. 1 and 2, after forming the P2 scribe lines, a light transmitting n-type doped top electrode layer 150 preferably made of a TCO material is next formed on top of buffer layer 140 for collecting current (electrons) from the cell and preferably absorbing a minimal amount of light which passes through to the light absorbing layer 130 (step 230). This creates additional active surface area for the collection of current by the top electrode which carries the charge to an external circuit. The P2 scribe line is also at least partially filled with the TCO material as shown in FIG. 1 on the vertical sidewalls of the P2 line and on top of bottom electrode layer 120 therein to form an electrical connection between the top electrode layer 150 and bottom electrode 120 creating an electron flow path.

Aluminum (Al) and Boron (B) are two possible n-type dopant that is commonly used for TCO top electrodes in thin film solar cells; however, others suitable conventional dopants may be used such as without limitation Aluminum (Al), Boron (B), Gallium (Ga), Indium (In) or other elements of group III of the periodic table.

In one embodiment, the TCO used for top electrode layer 150 may be any conventional material commonly used in the art for thin film solar cells. Suitable TCOs that may be used include without limitation zinc oxide (ZnO), Boron doped ZnO ("BZO"), Aluminum doped ZnO ("AZO"), Gallium doped ZnO ("GZO"), Indium doped ZnO ("IZO"), fluorine tin oxide ("FTO" or SnO$_2$:F), indium tin oxide ("ITO"), a carbon nanotube layer, or any other suitable coating materials possessing the desired properties for a top electrode. In one preferred embodiment, the TCO used is BZO.

In some possible embodiments where top electrode layer 150 may be made of Boron doped ZnO or "BZO", it should be noted that a thin intrinsic ZnO film may form on top of absorber layer 130 (not shown) during formation of the thicker n-type doped TCO top electrode layer 150.

With continuing reference to FIGS. 1 and 2, a first passivation-type layer in the form of protective moisture barrier layer 160 is next formed on top of top electrode layer 150 (step 235). Preferably, moisture barrier layer 160 is made of a water insoluble material, and more preferably in some embodiments without limitation of a water insoluble stable oxide compound which form an effective barrier with greatly reduced permeability to and transmission of moisture and/or oxygen therethrough than the TCO top electrode layer 150 material. This protects the TCO top electrode layer 150 from environmental water and/or oxygen attack which degrades the reliability and performance of the thin film solar cell device.

The inventors have discovered that suitable stable oxides that may be used to form the most effective water and oxygen proof barriers for moisture barrier layer 160 may be selected based on thermodynamic properties of such material compounds. In some embodiments, the suitability and stability of a given material for potential use as a protective moisture barrier layer 160 may be quantified based on thermodynamic properties of enthalpy such as Gibbs Free Energy (G) of formation, also referred to as "free enthalpy." Gibbs Free Energy is a measure of a composition's state of equilibrium and stability with respect to chemical reaction and change. Generally, the standard Gibbs Free Energy of formation is quantified by the change in free energy that occurs during the formation of 1 mole of a substance or compound in its standard state from its constituent elements in their standard states (the most stable form of the element at 1 bar of pressure and a specified temperature, such as 298.15 degrees Kelvin or 25 degrees Celsius). The concept of Gibbs Free Energy is well known to those skilled in the art without further elaboration.

Gibbs Free Energy may be defined by the following formula:

$$G(p,T)=H-TS$$

where G=Gibbs Free Energy, H=enthalpy, T=temperature, p=pressure, and S=entropy.

The Table found in FIG. 3 shows Gibbs Free Energy of various oxide compounds. Referring to FIG. 3, the inventors discovered that oxides of various elements having a Gibbs Free Energy or oxide formation enthalpy of at least about −600 KJ/mol (with 1 mole oxygen at 298.15 degrees Kelvin and 1 bar of pressure) or higher (i.e. more negative) would provide suitably stable oxide compounds for use as protective moisture barrier layer 160. Such materials are stable oxides which are insoluble to water. Accordingly, in some embodiment, oxides useable for protective moisture barrier layer 160 may include without limitation MgO, $In_2O_3$, CaO, $Ga_2O_3$, $Cr_2O_3$, $Ta_2O_5$, $TiO_2$, $ZrO_2$, $Al_2O_3$, $HfO_2$, $La_2O_3$, and $Lu_2O_3$. In some embodiments, therefore, suitable materials for moisture barrier layer 160 may have a Gibbs Free Energy in a range from about −600 to about −1260 KJ/mol based on the foregoing material compounds. Other suitable stable oxides that may be used having suitable Gibbs Free Energy include $SiON_x$, $SiN_x$, and $SiO_x$. In one embodiment, $TiO_2$ may be used which is cost effective and compatible with current industrial thin film solar cell fabrication processes.

In some embodiments, protective moisture barrier layer 160 may be comprised of two or more materials which are deposited as thin films on top electrode layer 150 from a combination of two or more of the foregoing materials.

With continuing reference to FIG. 3, oxide compounds generally having a Gibbs Free Energy of less than −600 (i.e. more positive) generally lack the suitable stability and/or insolubility to water and are less favored for use as moisture barrier layer 160.

In some embodiments, protective moisture barrier layer 160 may have a thickness of at least about 10 nm or more. In some embodiments, the thickness of layer 160 may be from about 10 nm to about 150 nm. If two or more compounds are used for forming barrier layer 160, the total combined thickness of the layers may be preferably about 10 nm to about 150 nm.

Protective moisture barrier layer 160 may be formed by any suitable method commonly used in the art for forming thin films. In some possible embodiments, layer 160 may be formed without limitation by atomic layer deposition (ALD), chemical vapor deposition (CVD), evaporation, or sputtering processes.

It should be noted that barrier layer 160 material is deposited and formed not only on the top of the top electrode layer 150 as shown in FIG. 1, but in some embodiments preferably also inside the previously formed P2 scribe line along the exposed vertical sidewall portions of top electrode layer 150 and further on top of the horizontal top surface of top electrode layer 150 formed above bottom electrode layer 120. Thus barrier layer 160 protects all previously deposited exposed surfaces of top electrode layer 150.

With continuing reference now to FIGS. 1 and 2, following formation of the protective barrier layer 160, the P3 scribe line is formed in thin film solar cell 100 (step 240). The P3 scribe line extends through (from top to bottom) barrier layer 160, top electrode layer 150, buffer layer 140, absorber layer 130, and the bottom electrode layer 120 down to the top of substrate 110 as shown.

Additional conventional back end of line processes and lamination may be performed following formation of the thin film solar cell structure disclosed herein, as will be well known and understood by those skilled in the art. This may include laminating a top cover glass onto the cell structure with a suitable encapsulant 170 there between such as without limitation a combination of EVA (ethylene vinyl acetate) and butyl to seal the cell (steps 245 and 250 in FIG. 2). The EVA and butyl encapsulant 170 is conventionally used in the art and applied directly onto the moisture barrier layer 160 in the present embodiment, followed by applying the top cover glass thereon.

Suitable further back end processes may then be completed (step 255) which may include forming front conductive grid contacts and one or more anti-reflective coatings (not shown) above top electrode 150 in a conventional manner well known in the art. The grid contacts will protrude upwards through and beyond the top surface of any anti-reflective coatings for connection to external circuits. The solar cell fabrication process produces a finished and complete thin film solar cell module 100 (step 260).

It should be noted that protective moisture barrier layer 160 is formed as part of the in-situ process of forming the multiple various semiconductor layers described herein and shown in FIGS. 1 and 2. In some instances, this advantageously provides a more effective moisture and oxygen resistant protective barrier for the TCO top electrode than prior processes in which the ex-situ processes of forming EVA and Butyl for laminating top cover glass onto the solar cell package is relied upon to protect the TCO film. The TCO top electrode film or layer is exposed to moisture and oxygen in the environment until the EVA/Butyl and top glass 1N are formed on the package and sealed.

Figure 4:
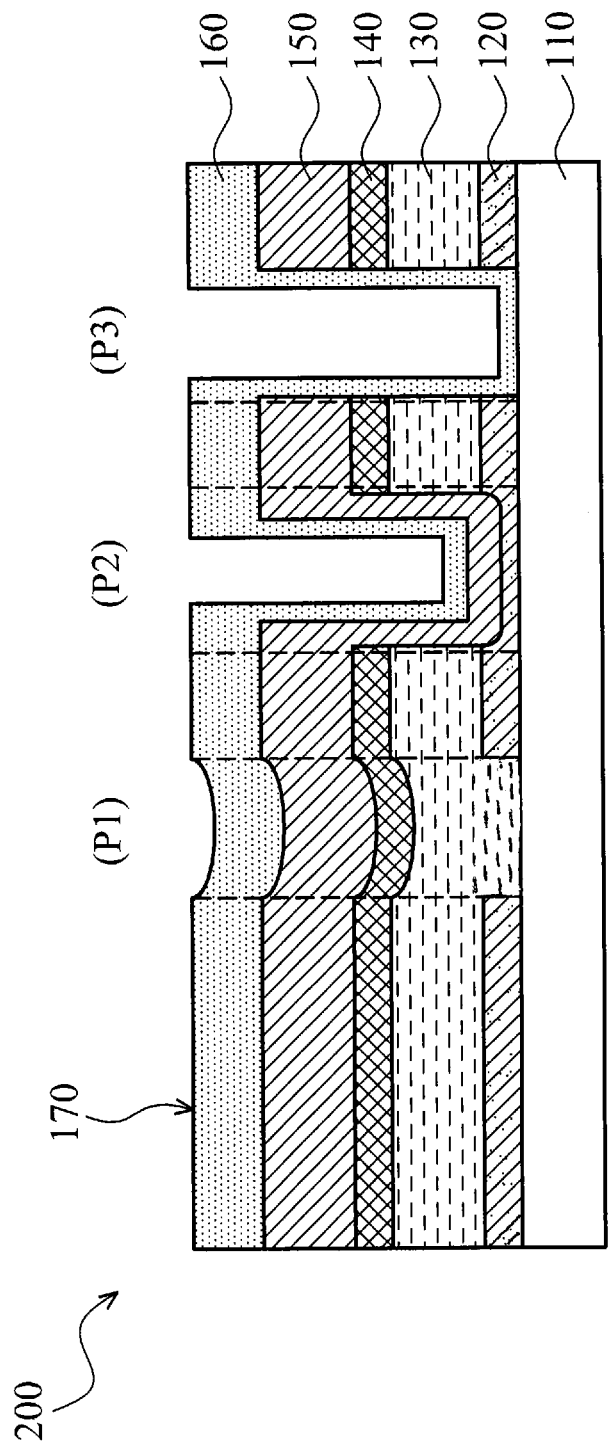
FIG. 4 is a cross-sectional side view of a second embodiment of a thin film solar cell according to the present invention.

FIGS. 4 and 5 respectively show a second embodiment of a thin film solar cell 200 and method for forming the same. The second embodiment and method are similar to the first embodiment and process for fabricating thin film solar cell 100 already described having an in-situ formed moisture barrier shown in FIGS. 1 and 2. However, the sequence of the same formation steps common in FIGS. 2 and 5 are varied in the second embodiment.

Referring to FIGS. 4 and 5, the P3 scribe line (step 240) immediately follows formation of the TCO top electrode layer 150 (step 230) in the second embodiment and occurs before the formation of protective moisture barrier 160 (step 235). In contrast to the first embodiment of FIG. 1, the sequence of steps in FIG. 5 produces a moisture barrier layer 160 that covers and protects the exposed sidewall and bottom surfaces of the solar cell package within the P3 scribe line from moisture and oxygen (see FIG. 4).

Figure 6:
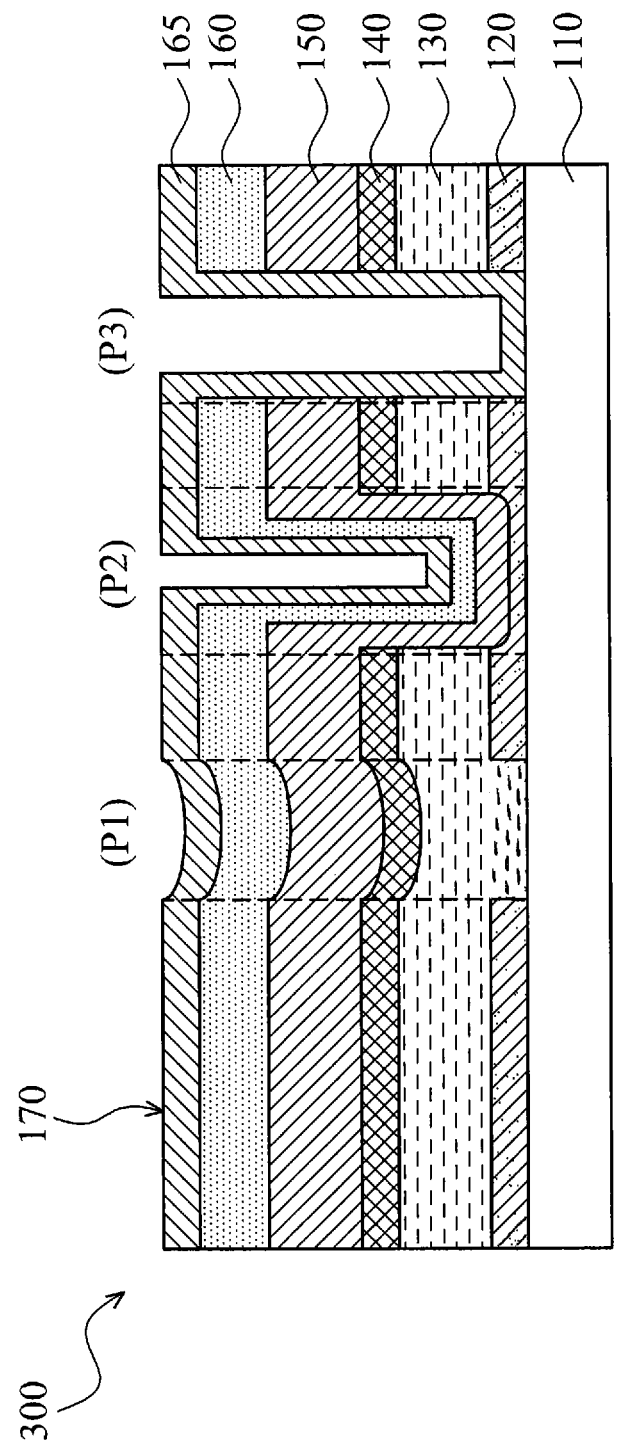
FIG. 6 is a cross-sectional side view of a third embodiment of a thin film solar cell according to the present invention.

FIGS. 6 and 7 respectively show a third embodiment of a thin film solar cell 300 and method for forming the same having a two-layer protective moisture barrier construction.

The third embodiment and method are also similar to the first embodiment and process for fabricating thin film solar cell 100 already described having an in-situ formed moisture barrier shown in FIGS. 1 and 2. However, the sequence of the same formation steps common in FIGS. 2 and 7 are varied in the third to provide for the formation of a second protective moisture barrier layer 165 (step 237) as shown in FIG. 6. This third embodiment process is a hybrid of the first and second embodiment fabrication processes shown in FIGS. 2 and 5 in that a protective moisture barrier (i.e. barriers 160 and 165) is formed both before and after the P3 scribe line is made. The top surface of first protective barrier layer 160 and both vertical and horizontal portions thereof within the P2 scribe line have a double protective film or coating as shown in FIG. 6. The exposed vertical and horizontal surfaces of the solar cell package 300 within the P3 scribe line contains only a single protective film or coating of the second moisture barrier layer 165.

Using the third embodiment with two-layer moisture barrier, it can not only protect TCO from environmental moisture damage not only on TCO surface but also from P3 sidewall. These two separated layers may be formed without limitation by atomic layer deposition (ALD), chemical vapor deposition (CVD), evaporation, or sputtering processes, etc.

It will be appreciated that the embodiments of the present thin film solar cell and fabrication methods described herein are not only suitable for providing protective moisture barriers for CIGS-based absorber layer solar cells, but may also be used with equal benefit for CdTe-based and other type thin film solar cells.

In one exemplary embodiment, a thin film solar cell includes a bottom electrode layer formed on a substrate, a semiconductor absorber layer formed on the bottom electrode layer, a buffer layer formed on the absorber layer, and a top electrode layer formed on the absorber layer, the top electrode layer being electrically connected to the bottom electrode layer through a P2 scribe line defining a vertical channel extending through the buffer and absorber layers. The solar cell further includes a protective first moisture barrier layer formed on the top electrode layer for protecting the top electrode layer from environmental moisture and oxygen damage, and an encapsulant formed on the first moisture barrier layer. The moisture barrier layer is formed of a material that is insoluble in water thereby resisting degradation and infiltration by water, in addition to oxygen and carbon dioxide which can damage the TCO top electrode. In some embodiments, the encapsulant may comprise EVA and butyl.

In another exemplary embodiment, a thin film solar cell includes a bottom electrode layer formed on a substrate, a semiconductor absorber layer formed on the bottom electrode layer, a buffer layer formed on the absorber layer, and a top electrode layer formed on the buffer layer and made of an electrically conductive TCO material. The top electrode layer is electrically connected to the bottom electrode layer through a P2 scribe line defining a vertical channel extending through the buffer and absorber layers. A protective first moisture barrier layer deposited on the top electrode layer is further provided for protecting the top electrode layer from environmental moisture and oxygen damage, wherein the first moisture barrier layer is made of a material that is insoluble in water. The first moisture barrier material covers portions of the top electrode layer material disposed in the P2 scribe line to protect the top electrode material from moisture and oxygen damage.

In one exemplary embodiment, a method for forming a thin film solar cell includes: depositing a conductive bottom electrode layer on a substrate; depositing an absorber layer on the bottom electrode layer; depositing a buffer layer on the absorber layer; cutting an open P2 scribe line in the absorber layer, the scribe line forming an open channel with exposed sidewalls on the absorber layer from exposed portions of the absorber and buffer layers; depositing a top electrode layer on the buffer layer after cutting the P2 scribe line, material from the top electrode layer at least partially filling the P2 scribe line; depositing a first moisture barrier layer made of a water-insoluble material on the top electrode layer; and covering portions of the top electrode layer material in the P2 scribe lines with the first moisture barrier layer material for protection against water and oxygen damage to the top electrode layer material within the P2 scribe line.

While the foregoing description and drawings represent preferred or exemplary embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. In addition, numerous variations in the preferred or exemplary methods and processes described herein may be made without departing from the spirit of the invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for forming a thin film solar cell comprising:
    depositing a conductive bottom electrode layer on a substrate;
    cutting a first set of scribe lines in the bottom electrode layer, the first set of scribe lines forming a first set of micro-channels in the bottom electrode layer;
    depositing an absorber layer on the bottom electrode layer, whereby the absorber layer is interconnected to the substrate through the first set of micro-channels formed by the first set of scribe lines;
    depositing a buffer layer on the absorber layer;
    cutting a second set of scribe lines in the absorber layer and the buffer layer, the second set of scribe lines forming a second set of micro-channels with exposed sidewalls in the absorber layer from exposed portions of the absorber layer and the buffer layer;
    depositing a top electrode layer on the buffer layer after cutting the second set of scribe lines, wherein material from the top electrode layer at least partially filling the second set of micro-channels and forming exposed vertical sidewall portions of the top electrode layer within the second set of micro-channels, wherein the top electrode layer interconnects to the bottom electrode layer thereby preventing the buffer layer from acting as a barrier between the top and bottom electrode layers; and depositing a first moisture barrier layer made of a water-insoluble material on the top electrode layer, wherein all exposed surfaces of the top electrode layer material including the exposed vertical sidewall portions of the top electrode layer within the second set of micro-channels are covered with the first moisture barrier layer material for protection against water and oxygen damage to the top electrode layer material within the second set of micro-channels.

2. The method of claim 1, wherein the step of depositing the first moisture barrier layer is formed as part of an in-situ process of said steps for forming said thin film solar cell.

3. The method of claim 1, further comprising laminating a top cover glass onto the thin film solar cell structure with an encapsulant there between to seal the thin film solar cell.

4. The method of claim 3, wherein the encapsulant is a combination of EVA (ethylene vinyl acetate) and butyl.

5. A method for forming a thin film solar cell comprising:
depositing a conductive bottom electrode layer on a substrate;
cutting a first set of scribe lines in the bottom electrode layer, the first set of scribe lines forming a first set of micro-channels in the bottom electrode layer;
depositing an absorber layer on the bottom electrode layer, whereby the absorber layer is interconnected to the substrate through the first set of micro-channels formed by the first set of scribe lines;
depositing a buffer layer on the absorber layer;
cutting a second set of scribe lines in the absorber layer and the buffer layer, the second set of scribe lines forming a second set of micro-channels with exposed sidewalls in the absorber layer from exposed portions of the absorber layer and the buffer layer;
depositing a top electrode layer on the buffer layer after cutting the second set of scribe lines, wherein material from the top electrode layer at least partially filling the second set of micro-channels and forming exposed vertical sidewall portions of the top electrode layer within the second set of micro-channels, wherein the top electrode layer interconnects to the bottom electrode layer thereby preventing the buffer layer from acting as a barrier between the top and bottom electrode layers;
cutting a third set of scribe lines extending completely through the top electrode, the buffer layer, the absorber layer, and the bottom electrode layer, the third set of scribe lines forming a third set of micro-channels isolating said thin film solar cell; and
depositing a first moisture barrier layer made of a water-insoluble material on the top electrode layer, wherein all exposed surfaces of the top electrode layer material including the exposed vertical sidewall portions of the top electrode layer within the second set of micro-channels, and the third set of micro-channels are covered with the first moisture barrier layer material for protection against water and oxygen damage to the top electrode layer material within the second set of micro-channels and the third set of micro-channels.

6. The method of claim 5, wherein the step of depositing the first moisture barrier layer is formed as part of an in-situ process of said steps for forming said thin film solar cell.

7. The method of claim 5, further comprising laminating a top cover glass onto the thin film solar cell structure with an encapsulant there between to seal the thin film solar cell.

8. The method of claim 7, wherein the encapsulant is a combination of EVA (ethylene vinyl acetate) and butyl.

9. The method of claim 7, further comprising forming a front conductive grid contacts and one or more anti-reflective coatings above the top electrode.

10. A method for forming a thin film solar cell comprising:
depositing a conductive bottom electrode layer on a substrate;
cutting a first set of scribe lines in the bottom electrode layer, the first set of scribe lines forming a first set of micro-channels in the bottom electrode layer;
depositing an absorber layer on the bottom electrode layer, whereby the absorber layer is interconnected to the substrate through the first set of micro-channels formed by the first set of scribe lines;
depositing a buffer layer on the absorber layer;
cutting a second set of scribe lines in the absorber layer and the buffer layer, the second set of scribe lines forming a second set of micro-channels with exposed sidewalls in the absorber layer from exposed portions of the absorber layer and the buffer layer;
depositing a top electrode layer on the buffer layer after cutting the second set of scribe lines, wherein material from the top electrode layer at least partially filling the second set of micro-channels and forming exposed vertical sidewall portions of the top electrode layer within the second set of micro-channels, wherein the top electrode layer interconnects to the bottom electrode layer thereby preventing the buffer layer from acting as a barrier between the top and bottom electrode layers;
depositing a first moisture barrier layer made of a water-insoluble material on the top electrode layer, wherein all exposed surfaces of the top electrode layer material including the exposed vertical sidewall portions of the top electrode layer within the second set of micro-channels, are covered with the first moisture barrier layer material for protection against water and oxygen damage to the top electrode layer material within the second set of micro-channels;
cutting a third set of scribe lines extending completely through the first moisture barrier layer, the top electrode, the buffer layer, the absorber layer, and the bottom electrode layer, the third set of scribe lines forming a third set of micro-channels isolating said thin film solar cell; and
depositing a second moisture barrier layer made of a water-insoluble material over the first moisture barrier layer, wherein all exposed surfaces of the top electrode layer material including the exposed vertical sidewall portions of the top electrode layer within the second set of micro-channels are covered with the first and second moisture barrier layer materials for protection against water and oxygen damage to the top electrode layer material within the second set of micro-channels, and all exposed surfaces of the top electrode layer material including the exposed vertical sidewall portions of the top electrode layer within the third set of micro-channels are covered with the second moisture barrier layer material for protection against water and oxygen damage to the top electrode material.

11. The method of claim 10, wherein the step of depositing the first moisture barrier layer is formed as part of an in-situ process of said steps for forming said thin film solar cell.

12. The method of claim 10, wherein the step of depositing the second moisture barrier layer is formed as part of an in-situ process of said steps for forming said thin film solar cell.

13. The method of claim 10, further comprising laminating a top cover glass onto the thin film solar cell structure with an encapsulant there between to seal the thin film solar cell.

14. The method of claim 13, wherein the encapsulant is a combination of EVA (ethylene vinyl acetate) and butyl.

15. The method of claim 13, further comprising forming a front conductive grid contacts and one or more anti-reflective coatings above the top electrode.

* * * * *